(12) United States Patent
Kim et al.

(10) Patent No.: US 12,347,517 B2
(45) Date of Patent: Jul. 1, 2025

(54) PIPE REGISTER AND SEMICONDUCTOR APPARATUS INCLUDING THE PIPE REGISTER

(71) Applicant: SK hynix Inc., Icheon-si (KR)

(72) Inventors: Heon Ki Kim, Icheon-si (KR); Kyeong Min Chae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 139 days.

(21) Appl. No.: 18/115,999

(22) Filed: Mar. 1, 2023

(65) Prior Publication Data
US 2024/0161793 A1 May 16, 2024

(30) Foreign Application Priority Data

Nov. 15, 2022 (KR) .................. 10-2022-0152693

(51) Int. Cl.
*G11C 7/10* (2006.01)
*G11C 7/22* (2006.01)

(52) U.S. Cl.
CPC .......... *G11C 7/1063* (2013.01); *G11C 7/106* (2013.01); *G11C 7/1066* (2013.01); *G11C 7/222* (2013.01)

(58) Field of Classification Search
CPC ..... G11C 7/1063; G11C 7/106; G11C 7/1066; G11C 7/222; G11C 7/1039; G11C 19/28; G11C 7/1006
USPC ...................................... 365/189.05
See application file for complete search history.

(56) References Cited

U.S. PATENT DOCUMENTS

| | | | | |
|---|---|---|---|---|
| 6,160,754 A | * | 12/2000 | Suh | G11C 7/1051 365/194 |
| 6,404,697 B1 | * | 6/2002 | Ryu | G11C 7/1018 365/230.02 |
| 9,299,399 B2 | | 3/2016 | Lim et al. | |
| 9,659,612 B1 | * | 5/2017 | Hong | G11C 7/1063 |
| 2004/0095178 A1 | * | 5/2004 | Bang | G11C 7/103 327/215 |

* cited by examiner

*Primary Examiner* — Tha-O H Bui
(74) *Attorney, Agent, or Firm* — WILLIAM PARK & ASSOCIATES LTD.

(57) ABSTRACT

A pipe register includes: a plurality of register units configured to output data in response to control signals; and a pipe control circuit configured to generate a reference timing signal by dividing a clock signal, the clock signal activated during an activation time of a read enable signal, and generate the control signals based on the read enable signal and the reference timing signal.

17 Claims, 9 Drawing Sheets

PIPE REGISTER AND SEMICONDUCTOR APPARATUS INCLUDING THE PIPE REGISTER

CROSS-REFERENCES TO RELATED APPLICATION

The present application claims priority under 35 U.S.C. § 119(a) to Korean application number 10-2022-0152693, filed on Nov. 15, 2022, in the Korean Intellectual Property Office, which is incorporated herein by reference in its entirety.

BACKGROUND

1. Technical Field

Various embodiments generally relate to a semiconductor circuit, and more particularly, to a pipe register and a semiconductor apparatus including the pipe register.

2. Related Art

As related technology progresses, a semiconductor apparatus, e.g., a semiconductor memory device, is required to operate faster while consuming less power.

Semiconductor memory devices are requested to send or receive a plurality of data, e.g., 16, 32 or 64 bit data, simultaneously to perform such high-speed operation. To send a plurality of data simultaneously, a semiconductor memory device may include a pipe register for storing a plurality of output data therein for increasing the data output rate. To achieve a high-speed operation, it may be required to improve the timing margin between a control signal employed for controlling the operation of the pipe register and the data output from the pipe register.

SUMMARY

In an embodiment, a pipe register may include: a plurality of register units configured to output data in response to control signals; and a pipe control circuit configured to generate a reference timing signal by dividing a clock signal, the clock signal activated during an activation time of a read enable signal, and generate the control signals based on the read enable signal and reference timing signal. The pipe control circuit may activate the control signal before the clock signal is activated.

In an embodiment, a pipe register may include: a first register group configured to output a first preliminary data in response to a first latch control signal; a second register group configured to output a second preliminary data in response to a second latch control signal; and a pipe control circuit configured to generate a first reference timing signal and a second reference timing signal by dividing a clock signal, the clock signal activated during an activation time of a read enable signal, and generate the first latch control signal and the second latch control signal based on the read enable signal, the first reference timing signal, and the second reference timing signal.

In an embodiment, a semiconductor apparatus may include: a memory region; an input/output pad unit; and a data input/output circuit configured to input/output data between the memory region and the input/output pad unit, wherein the data input/output circuit is configured to latch data output from the memory region based on a read enable signal and to output the latched data to an external of the semiconductor apparatus in synchronization with a clock signal, the clock signal being provided from the external of the semiconductor apparatus during an activation time of the read enable signal.

DETAILED DESCRIPTION

Various embodiments are directed to a pipe register capable of improving a timing margin between a control signal employed for controlling operation of the pipe register and the data output from the pipe register, and a semiconductor apparatus including the same.

Various embodiments of the present disclosure will be described below with reference to the appended drawings.

Figure 1:
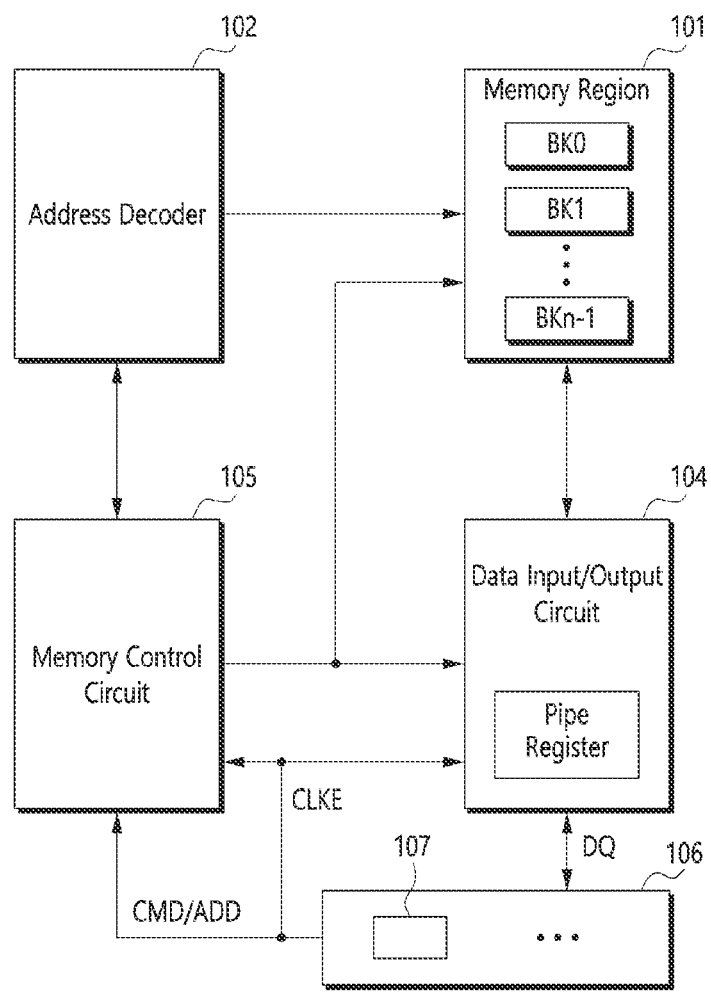
FIG. 1 is a block diagram illustrating the configuration of a semiconductor apparatus in accordance with an embodiment.

FIG. 1 is a block diagram illustrating the configuration of a semiconductor apparatus in accordance with an embodiment.

Referring to FIG. 1, the semiconductor apparatus 100 in accordance with the embodiment may include a memory region 101, an address decoder 102, a data input/output circuit 104, and a memory control circuit 105.

The memory region 101 may include a plurality of memory cells, and the plurality of memory cells may include at least one of volatile memories and non-volatile memories. Examples of the volatile memory may include static RAM (SRAM), dynamic RAM (DRAM), and synchronous DRAM (SDRAM). Examples of the non-volatile memory may include read only memory (ROM), programmable ROM (PROM), electrically erasable and programmable ROM (EEPROM), electrically programmable ROM (EPROM), flash memory, phase change RAM (PRAM), magnetic RAM (MRAM), resistive RAM (RRAM), and ferroelectric RAM (FRAM). The memory cells of the memory region 101 may be classified into a plurality of unit memory regions, e.g., a plurality of memory banks BK0 to BKn−1, where n is a natural number.

The address decoder 102 may be coupled to the memory control circuit 105 and the memory region 101. The address decoder 102 may decode an address signal provided from the memory control circuit 105 and access the memory region 101 in response to a decoded result.

The data input/output circuit 104 may be coupled to the memory region 101. The data input/output circuit 104 may exchange data with an external system or the memory region 101. The data input/output circuit 104 may include a pipe register. The data input/output circuit 104 may latch data output from the memory region 101 based on a read enable signal, and output the data based on a clock signal CLKE to the external of the semiconductor apparatus 100. The clock signal CLKE may be provided from the external of the semiconductor apparatus 100 in a first time from an activation time of the read enable signal.

The memory control circuit 105 may be coupled to the memory region 101, the address decoder 102, and the data input/output circuit 104. The memory control circuit 105 may perform control operations related to a test operation, a read operation, a write operation, and an address processing of the semiconductor apparatus 100. The memory control circuit 105 may receive a command CMD, an address ADD, and the clock signal CLKE. The memory control circuit 105 may provide the data input/output circuit 104 with the address decoded by the address decoder 102. The clock signal CLKE may be provided from the external of the semiconductor apparatus, e.g., a memory controller or a host system.

An input/output pad unit 106 may receive the command CMD, the address ADD, and the clock signal CLKE, and include a plurality of pads 107 configured to input/output data DQ.

Figure 2:
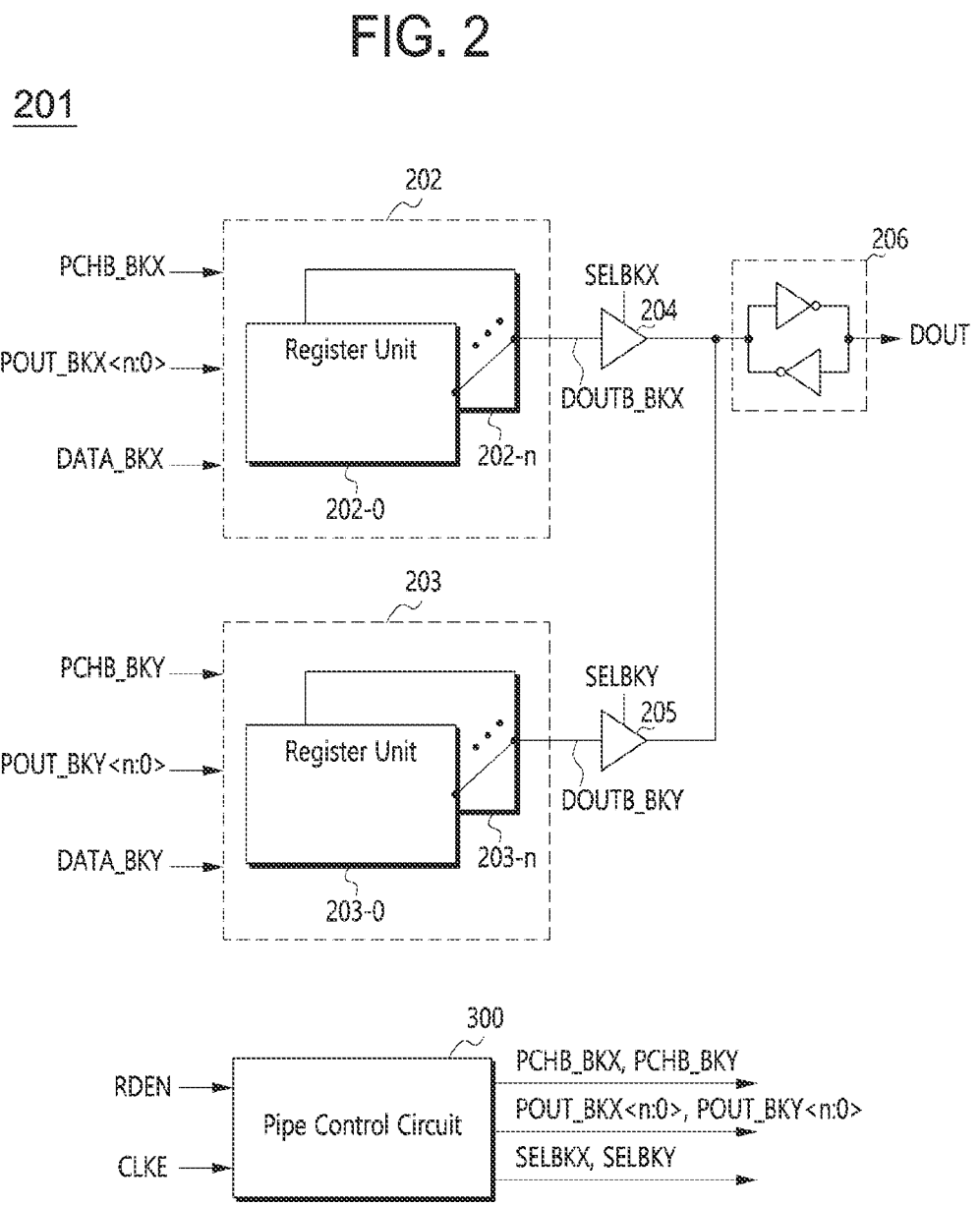
FIG. 2 is a block diagram illustrating the configuration of a pipe register in accordance with an embodiment.

FIG. 2 is a block diagram illustrating the configuration of a pipe register 201 in accordance with an embodiment.

Referring to FIG. 2, the pipe register 201 may include a plurality of register groups (i.e., first register group 202 and second register group 203), a first switch 204, a second switch 205, and a pipe control circuit 300. The pipe register 201 may further include a latch 206.

FIG. 2 shows an example of a configuration of the pipe register 201 where the semiconductor apparatus 100 in FIG. 1 outputs data through two memory banks among the plurality of memory banks BK0 to BKn-1 in accordance with a read command. Accordingly, a plurality of register units 202-0 to 202-n and 203-0 to 203-n may be divided into a first register group 202 and a second register group 203, respectively, which correspond to two memory banks respectively. The first register group 202 may be assigned to a first memory bank BKX of the two memory banks and the second register group 203 may be assigned to a second memory bank BKY of the two memory banks.

The plurality of register groups 202 and 203 may latch data DATA_BKX and DATA_BKY and output the latched data in response to a plurality of control signals PCHB_BKX, PCHB_BKY, POUT_BKX<n:0>, and POUT_BKY<n:0>.

Hereinafter, DATA_BKX is referred to as a first bank data, DATA_BKY is referred to as a second bank data, PCHB_BKX and POUT_BKX<n:0> are referred to as first latch control signals, and PCHB_BKY and POUT_BKY<n:0> are referred to as second latch control signals.

The first register group 202 may latch the first bank data DATA_BKX and output the latched data as a first preliminary data DOUTB_BKX in response to the first latch control signals PCHB_BKX and POUT_BKX<n:0>. The first register group 202 may include the plurality of register units 202-0 to 202-n. The number of the register units 202-0 to 202-n may correspond to the number of data output from the first memory bank BKX.

The second register group 203 may latch the second bank data DATA_BKY and output the latched data as a second preliminary data DOUTB_BKY in response to the second latch control signals PCHB_BKY and POUT_BKY<n:0>. The second register group 203 may include the plurality of register units 203-0 to 203-n. The number of the register units 203-0 to 203-n may correspond to the number of data output from the second memory bank BKY.

The first switch 204 may transfer the first preliminary data DOUTB_BKX to the latch 206 in response to a first selection signal SELBKX. The first switch 204 may transfer the first preliminary data DOUTB_BKX to the latch 206 when the first selection signal SELBKX is activated, and block the transfer of the first preliminary data DOUTB_BKX to the latch 206 when the first selection signal SELBKX is not activated.

The second switch 205 may transfer the second preliminary data DOUTB_BKY to the latch 206 in response to a second selection signal SELBKY. The second switch 205 may transfer the second preliminary data DOUTB_BKY to the latch 206 when the second selection signal SELBKY is activated, and block the transfer of the second preliminary data DOUTB_BKY to the latch 206 when the second selection signal SELBKY is not activated.

The latch 206 may latch the first preliminary data DOUTB_BKX and the second preliminary data DOUTB_BKY as output data DOUT.

The pipe control circuit 300 may receive a read enable signal RDEN and the clock signal CLKE and output a plurality of control signals for controlling the register groups 202 and 203, the first switch 204, and the second switch 205. The plurality of control signals may include the first latch control signals PCHB_BKX and POUT_BKX<n:0>, the second latch control signals PCHB_BKY and POUT_BKY<n:0>, the first selection signal SELBKX, and the second selection signal SELBKY.

The pipe control circuit 300 may generate a reference timing signal by dividing the clock signal CLKE which is activated in the first time from an activation time of the read enable signal RDEN. The pipe control circuit 300 may generate the first latch control signals PCHB_BKX and POUT_BKX<n:0>, the second latch control signals PCHB_BKY and POUT_BKY<n:0>, the first selection signal SELBKX, and the second selection signal SELBKY based on the read enable signal RDEN and reference timing signal.

Figure 3:
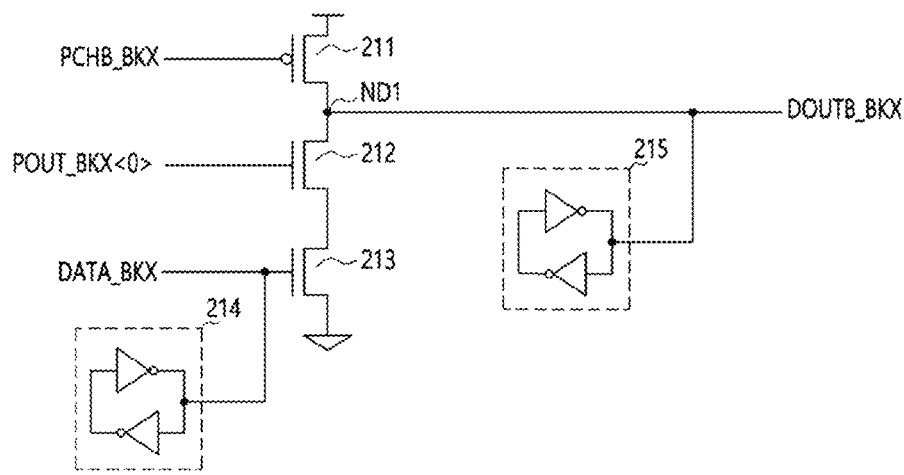
FIG. 3 is a circuit diagram illustrating the configuration of a register unit of FIG. 2.

FIG. 3 is a circuit diagram illustrating the configuration of an example of the register unit 202-0 shown in FIG. 2.

Referring to FIG. 3, the register unit 202-0 may include first to third transistors 211 to 213, a first latch 214, and a second latch 215. The register units of the first and second register groups 202 and 203 may be configured in the same way as the register unit 202-0 except that the designations of the signals input thereto and output therefrom may be different.

The first transistor 211 may have a source terminal coupled to a power supply terminal, a drain terminal coupled to a node ND1, and a gate terminal configured to receive the first latch control signal PCHB_BKX. The second transistor 212 may have a drain terminal coupled to the node ND1 and a gate terminal configured to receive a first latch control signal POUT_BKX<0> corresponding to its order. The third transistor 213 may have a source terminal coupled to a ground terminal, a gate terminal configured to receive the first bank data DATA_BKX, and a drain terminal coupled to a source terminal of the second transistor 212. The third transistor 213 may output the first preliminary data DOUTB_BKX through the node ND1. The first latch 214 may be coupled to the gate terminal of the third transistor 213 and latch the first bank data DATA_BKX. The second latch 215 may be coupled to the node ND1 and latch the first preliminary data DOUTB_BKX.

The register unit 202-1 may precharge the node ND1 as a high level as the first latch control signal PCHB_BKX is activated as a low level. When the first latch control signal POUT_BKX<0> is activated as a high level, the register unit 202-0 may maintain the node ND1 as the high level which is the level according to the already performed precharge operation or drive as the low level in accordance with the level of the first bank data DATA_BKX, and thus generate the first preliminary data DOUTB_BKX. For example, when the first bank data DATA_BKX has the low level, the third transistor 213 is turned off, and thus the first preliminary data DOUTB_BKX is output at the high level. The output data DOUT is converted by the latch 206 of FIG. 2 and may be output at the low level that is the same as the first bank data DATA_BKX. When the first bank data DATA_BKX has the high level, the third transistor 213 is turned on, and thus the node ND1 is driven at the low level and the first preliminary data DOUTB_BKX is output at the low level. The output data DOUT is converted by the latch 206 of FIG. 2 and may be output at the high level that is the same as the first bank data DATA_BKX.

Figure 4:
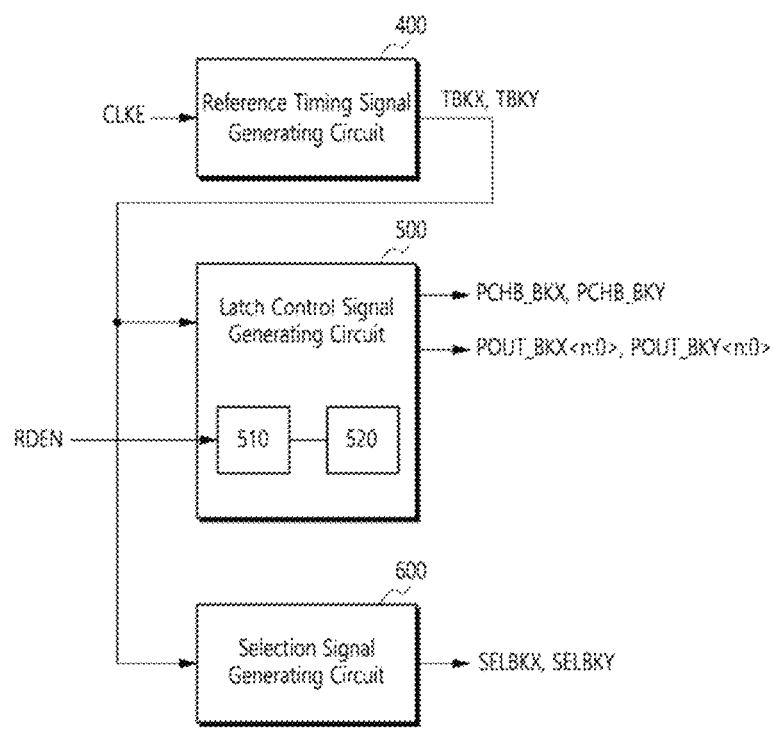
FIG. 4 is a block diagram illustrating the configuration of a pipe control circuit of FIG. 2.

FIG. 4 is a block diagram illustrating the configuration of the pipe control circuit 300 of FIG. 2.

Referring to FIG. 4, the pipe control circuit 300 may include a reference timing signal generating circuit 400, a latch control signal generating circuit 500, and a selection signal generating circuit 600.

The reference timing signal generating circuit 400 may receive the clock signal CLKE and output reference timing signals TBKX and TBKY, e.g., a first reference timing signal TBKX and a second reference timing signal TBKY. The reference timing signal generating circuit 400 may generate the first reference timing signal TBKX and the second reference timing signal TBKY in accordance with the clock signal CLKE.

The latch control signal generating circuit 500 may receive the read enable signal RDEN, the first reference timing signal TBKX and the second reference timing signal TBKY and output the first latch control signals PCHB_BKX and POUT_BKX<n:0> and the second latch control signals PCHB_BKY and POUT_BKY<n:0>. The latch control signal generating circuit 500 may generate the first latch control signals PCHB_BKX and POUT_BKX<n:0> and the second latch control signals PCHB_BKY and POUT_BKY<n:0> in accordance with the first reference timing signal TBKX and the second reference timing signal TBKY, respectively. The latch control signal generating circuit 500 may include a first logic circuit 510 and a second logic circuit 520.

The selection signal generating circuit 600 may receive the first reference timing signal TBKX and the second reference timing signal TBKY and output the first selection signal SELBKX and the second selection signal SELBKY. The selection signal generating circuit 600 may generate the first selection signal SELBKX and the second selection signal SELBKY in accordance with the first reference timing signal TBKX and the second reference timing signal TBKY, respectively.

Figure 5:
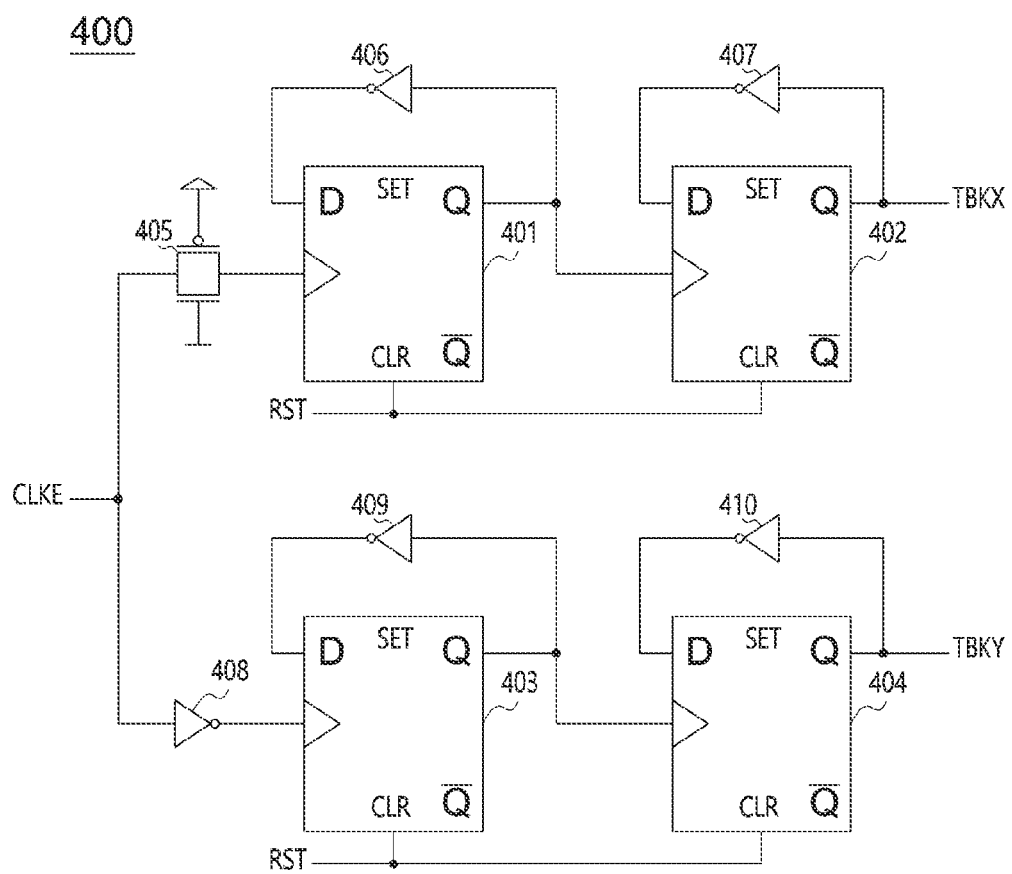
FIG. 5 is a circuit diagram illustrating the configuration of a reference timing signal generating circuit of FIG. 4.

FIG. 5 is a circuit diagram illustrating the configuration of the reference timing signal generating circuit 400 of FIG. 4.

Referring to FIG. 5, the reference timing signal generating circuit 400 may be configured as a divider circuit which divides the clock signal CLKE and generates the first reference timing signal TBKX and the second reference timing signal TBKY. FIG. 5 shows an example of the divider circuit configured to divide the clock signal CLKE into two signals and generate the first reference timing signal TBKX and the second reference timing signal TBKY based on the divided signals.

The reference timing signal generating circuit 400 may include a plurality of flip-flops 401 to 404 and a plurality of logic gates 405 to 410. The first flip-flop 401 may receive the clock signal CLKE at the clock terminal through the first logic gate 405 and feed an inverted output signal which is generated by inverting output signal of an output terminal Q thereof at the second logic gate 406 back to an input terminal D thereof. The second flip-flop 402 may be coupled to the output terminal of first the flip-flop 401 at the clock terminal and feed an inverted output signal which is generated by inverting output signal of an output terminal Q thereof at the third logic gate 407 back to an input terminal D thereof. The second flip-flop 402 may output the first reference timing signal TBKX at the output terminal Q. The third flip-flop 403 may receive an inverted clock signal CLKE which is inverted by the fourth logic gate 408 at the clock terminal and feed an inverted output signal which is generated by inverting output signal of an output terminal Q thereof at the fifth logic gate 409 back to an input terminal D thereof. The fourth flip-flop 404 may be coupled to the output terminal of the third flip-flop 403 at the clock terminal, and feed an inverted output signal which is generated by inverting output signal of an output terminal Q thereof at the sixth logic gate 410 back to an input terminal D thereof. The fourth flip-flop 404 may output the second reference timing signal TBKY at the output terminal Q. As shown in FIG. 5, each flip-flop 401 to 404 may receive a reset signal RST.

Figure 6:
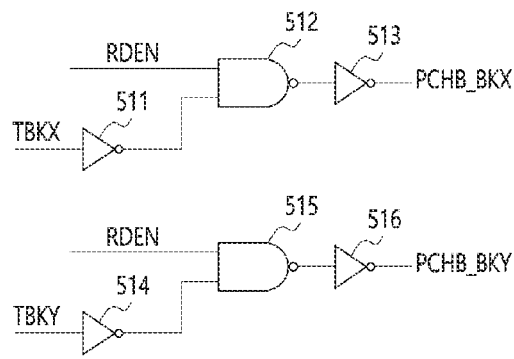
FIG. 6 is a circuit diagram illustrating the configuration of a first logic circuit of a latch control signal generating circuit of FIG. 4.

FIG. 6 is a circuit diagram illustrating the configuration of the first logic circuit 510 of the latch control signal generating circuit 500 of FIG. 4.

Referring to FIG. 6, the first logic circuit 510 may generate PCHB_BKX which is one of the first latch control signals PCHB_BKX and POUT_BKX<n:0> and PCHB_BKY which is one of the second latch control signals PCHB_BKY and POUT_BKY<n:0> based on the first reference timing signal TBKX and the second reference timing signal TBKY.

The first logic circuit 510 may include a plurality of logic gates 511 to 516. The logic gates 511 to 513 may invert the first reference timing signal TBKX, perform an AND operation on the inversion of the first reference timing signal TBKX and the read enable signal RDEN, and output the AND operation result as one signal PCHB_BKX of the first latch control signals PCHB_BKX and POUT_BKX<n:0>. The logic gates 514 to 516 may invert the second reference timing signal TBKY, perform an AND operation on the inversion of the second reference timing signal TBKY and the read enable signal RDEN, and output the AND operation result as one signal PCHB_BKY of the second latch control signals PCHB_BKY and POUT_BKY<n:0>.

Figure 7A:
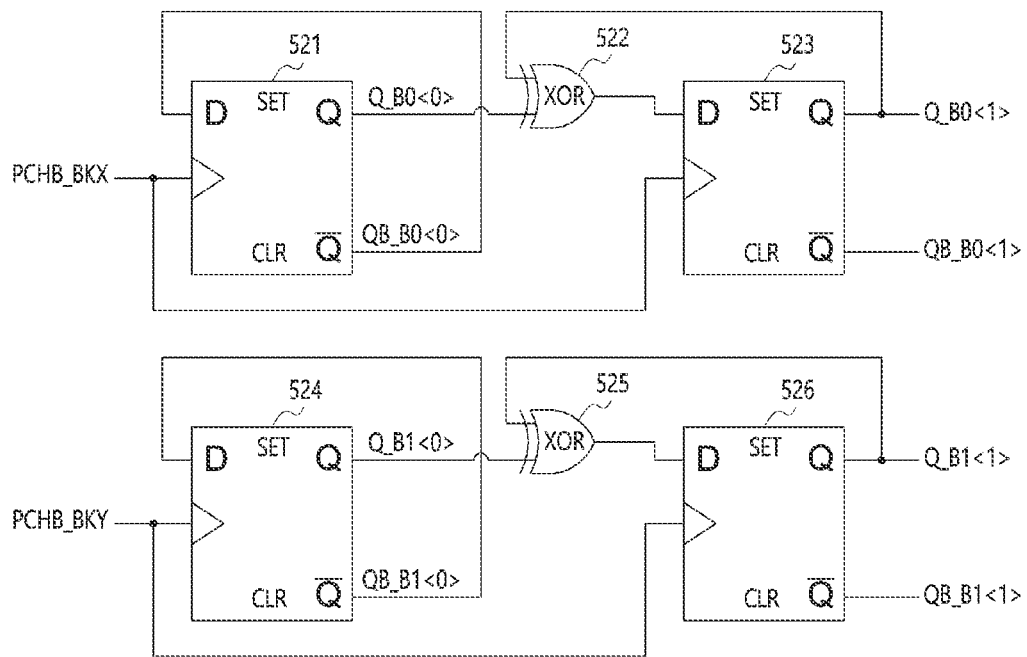
FIG. 7A is a circuit diagram illustrating the configuration of a first sub-logic circuit of a second logic circuit in the latch control signal generating circuit of FIG. 4.
Figure 7B:
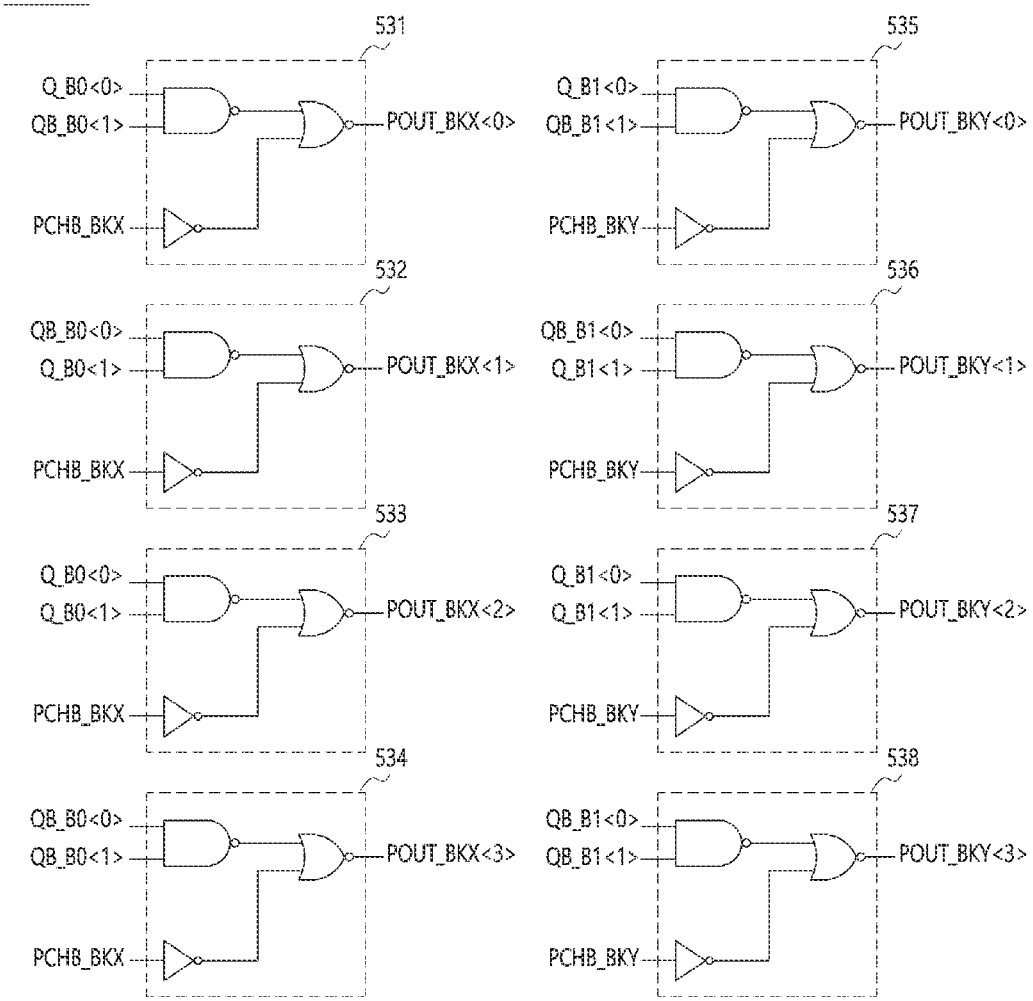
FIG. 7B is a circuit diagram illustrating the configuration of a second sub-logic circuit of the second logic circuit in the latch control signal generating circuit of FIG. 4.
Figure 7C:
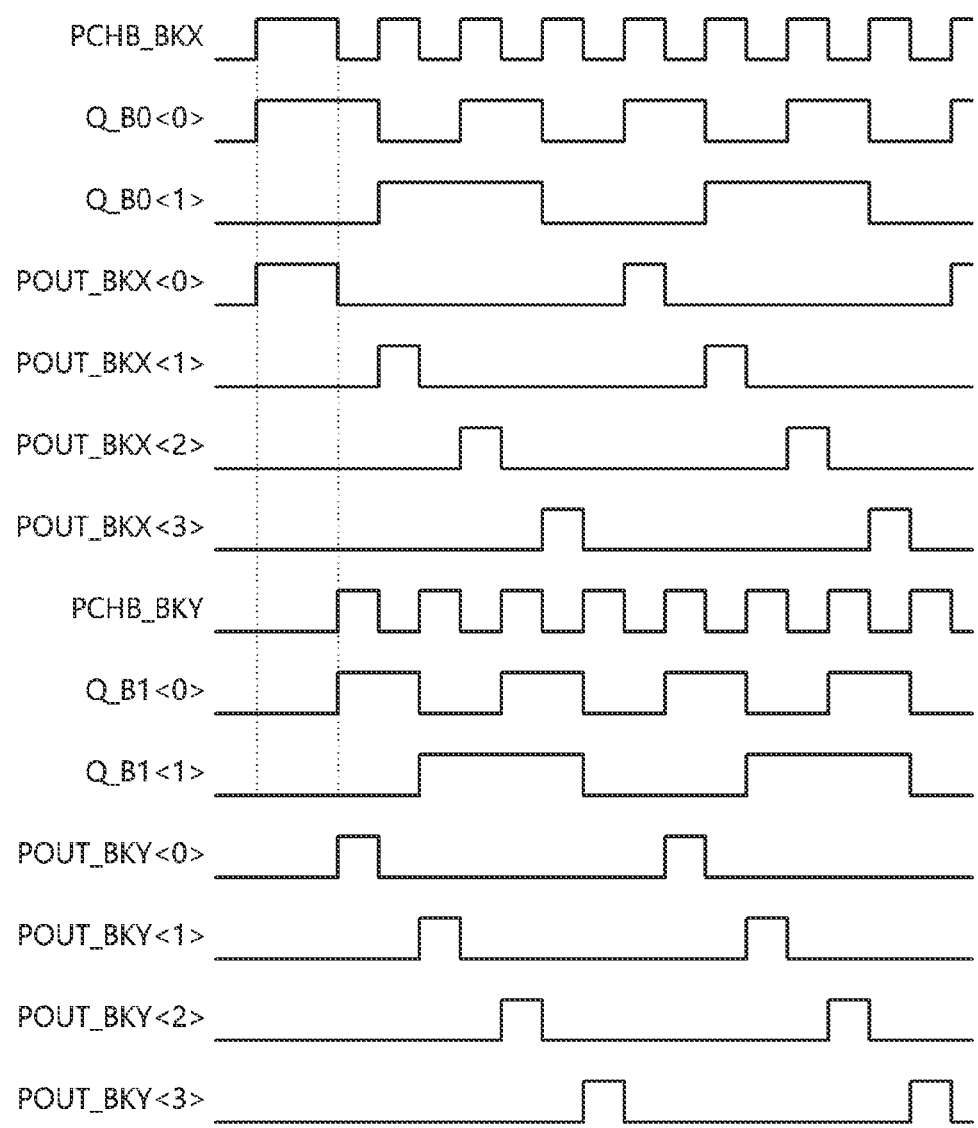
FIG. 7C is a timing diagram illustrating an operation of the second logic circuit of the latch control signal generating circuit of FIG. 4.

FIG. 7A is a circuit diagram illustrating the configuration of a first sub-logic circuit 520-1 of the second logic circuit 520, FIG. 7B is a circuit diagram illustrating the configuration of a second sub-logic circuit 520-2 of the second logic circuit 520, and FIG. 7C is a timing diagram illustrating an operation of the second logic circuit 520. Hereinafter, the configuration and operation of the second logic circuit 520 will be described with reference to FIGS. 7A to 7C.

The second logic circuit 520 may be configured as a masking circuit which select a pulse corresponding to a desired timing among pulses of the first and second latch control signals PCHB_BKX and PCHB_BKY, while masking the other pulses, and output the first and second latch control signals POUT_BKX<n:0> and POUT_BKY<n:0>.

Referring to FIG. 7A, the first sub-logic circuit 520-1 of the second logic circuit 520 may generate preliminary signals Q_B0<0:1>, QB_B0<0:1>, Q_B1<0:1>, and QB_B1<0:1> in accordance with the first and second latch control signals PCHB_BKX and PCHB_BKY. The first sub-logic circuit 520-1 may include a plurality of flip-flops 521, 523, 524, and 526 and a plurality of logic gates 522 and 525. The first flip-flop 521 may receive the first latch control signal PCHB_BKX at a clock terminal and feed an inverted output signal QB_B0<0> from its inverted output terminal /Q back to its input terminal D. The first flip-flop 521 may generate an output signal Q_B0<0> at the output terminal Q and the inverted output signal QB_B0<0> at the inverted output terminal /Q. The second flip-flop 523 may receive the first latch control signal PCHB_BKX at a clock terminal. The second flip-flop 523 may generate an output signal Q_B0<1> at an output terminal Q and an inverted output signal QB_B0<1> at an inverted output terminal /Q. The first logic gate 522 may perform XOR operation on the logic level of the output terminal Q of the first flip-flop 521 and the logic level of the output terminal Q of the second flip-flop 523 and provide the XOR operation result to an input terminal D of the second flip-flop 523. The third flip-flop 524 may receive the second latch control signal PCHB_BKY at a clock terminal and feed an inverted output signal QB_B1<0> from its inverted output terminal /Q back to its input terminal D. The third flip-flop 524 may generate an output signal Q_B1<0> at the output terminal Q and an inverted output signal QB_B1<0> at the inverted output terminal /Q. The fourth flip-flop 526 may receive the second latch control signal PCHB_BKY at a clock terminal. The fourth flip-flop 526 may generate an output signal Q_B1<1> at an output terminal Q and an inverted output signal QB_B1<1> at an inverted output terminal /Q. The second logic gate 525 may perform XOR operation on the logic level of the output terminal Q of the third flip-flop 524 and the logic level of the output terminal Q of the fourth flip-flop 526 and provide the XOR operation result to the input terminal D of the fourth flip-flop 526.

Referring to FIG. 7B, the second sub-logic circuit 520-2 of the second logic circuit 520 may generate the signals POUT_BKX<n:0> of the first latch control signals PCHB_BKX and POUT_BKX<n:0> and the signals POUT_BKY<n:0> of the second latch control signals PCHB_BKY and POUT_BKY<n:0> in accordance with the preliminary signals Q_B0<0:1>, QB_B0<0:1>, Q_B1<0:1>, and QB_B1<0:1>. The second sub-logic circuit 520-2 may include a plurality of logic circuits 531 to 538. The logic circuits 531 to 534 may generate the first latch control signals POUT_BKX<n:0> by combining the first latch control signal PCHB_BKX and the preliminary signals Q_B0<0:1>, QB_B0<0:1>, as illustrated in FIG. 7C. The logic circuits 535 to 538 may generate the second latch control signals POUT_BKY<n:0> by combining the second latch control signal PCHB_BKY and the preliminary signals Q_B1<0:1>, and QB_B1<0:1>. Each of the logic circuits 531 to 534 may have the same configuration. Each of the logic circuits 531 to 534 may perform a NOR operation on a NAND operation result of two of the preliminary signals Q_B0<0:1> and QB_B0<0:1> and an inverted signal of one of the first and second latch control signals PCHB_BKX and PCHB_BKY and output the NOR operation result as one of the first and second latch control signals POUT_BKX<n:0> and POUT_BKY<n:0>. For example, the logic circuit 531 may perform the NOR operation on the NAND operation result of two signals Q_B0<0> and QB_B0<1> of the preliminary signals Q_B0<0:1>, QB_B0<0:1>, Q_B1<0:1>, and QB_B1<0:1> and the inverted signal of the first latch control signal PCHB_BKX, and output the NOR operation result as one first latch control signal POUT_BKX<n:0> of the first and second latch control signals POUT_BKX<n:0> and POUT_BKY<n:0>.

The second logic circuit 520 may generate the preliminary signals Q_B0<0:1>, QB_B0<0:1>, Q_B1<0:1>, and QB_B1<0:1> based on the first and second latch control signals PCHB_BKX and PCHB_BKY and perform masking operation by differently combining the preliminary signals Q_B0<0:1>, QB_B0<0:1>, Q_B1<0:1>, and QB_B1<0:1> with the first and second latch control signals PCHB_BKX and PCHB_BKY from each other such that each of the first and second latch control signals POUT_BKX<n:0> and POUT_BKY<n:0> has a activation section which is not overlapped from each other as illustrated in FIG. 7C.

Figure 8:
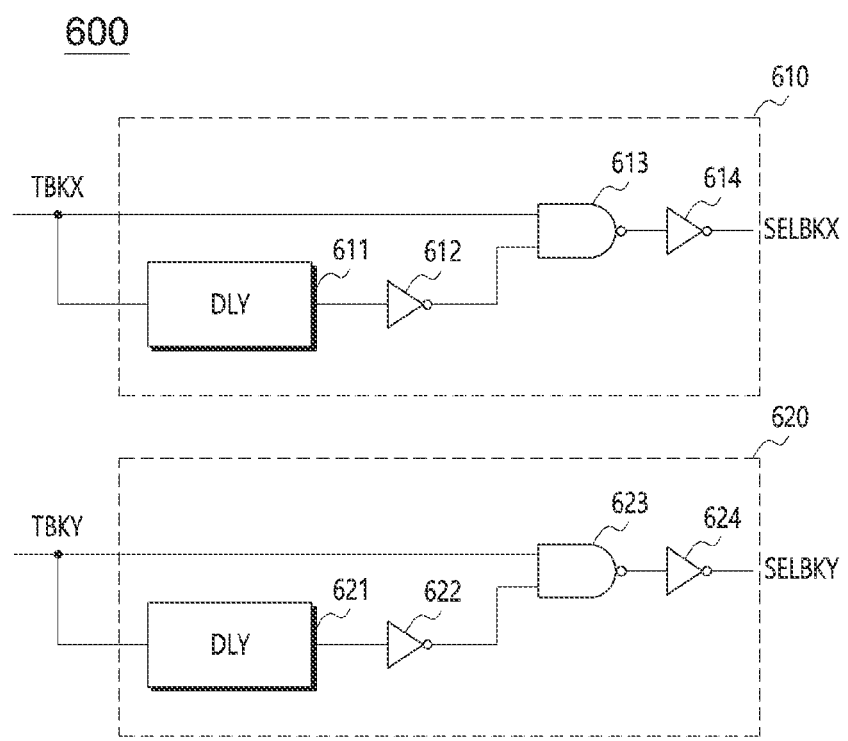
FIG. 8 is a circuit diagram illustrating the configuration of a selection signal generating circuit of FIG. 4.

FIG. 8 is a circuit diagram illustrating the configuration of the selection signal generating circuit 600 of FIG. 4.

Referring to FIG. 8, the selection signal generating circuit 600 may include a first selection signal generating unit 610 and a second selection signal generating unit 620.

The first selection signal generating unit 610 may generate the first selection signal SELBKX in accordance with the first reference timing signal TBKX. The first selection signal generating unit 610 may include a delay 611 and a plurality of logic gates 612 to 614. The delay 611 may delay the first reference timing signal TBKX by a predetermined time and the first logic gate 612 may invert the delayed first reference timing signal. The second and third logic gates 613 and 614 perform an AND operation on the first reference timing signal TBKX and the output of the first logic gate 612 and output the AND operation result as the first selection signal SELBKX. The word "predetermined" as used herein with respect to a parameter, such as a predetermined time and predetermined time interval, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The second selection signal generating unit 620 may generate the second selection signal SELBKY in accordance with the second reference timing signal TBKY. The second selection signal generating unit 620 may include a delay 621 and a plurality of logic gates 622 to 624. The delay 621 may delay the second reference timing signal TBKY by a predetermined time and the first logic gate 622 may invert the delayed second reference timing signal. The second and third logic gates 623 and 624 perform an AND operation on the second reference timing signal TBKY and the output of the first logic gate 622 and output the AND operation result as the second selection signal SELBKY.

Figure 9:
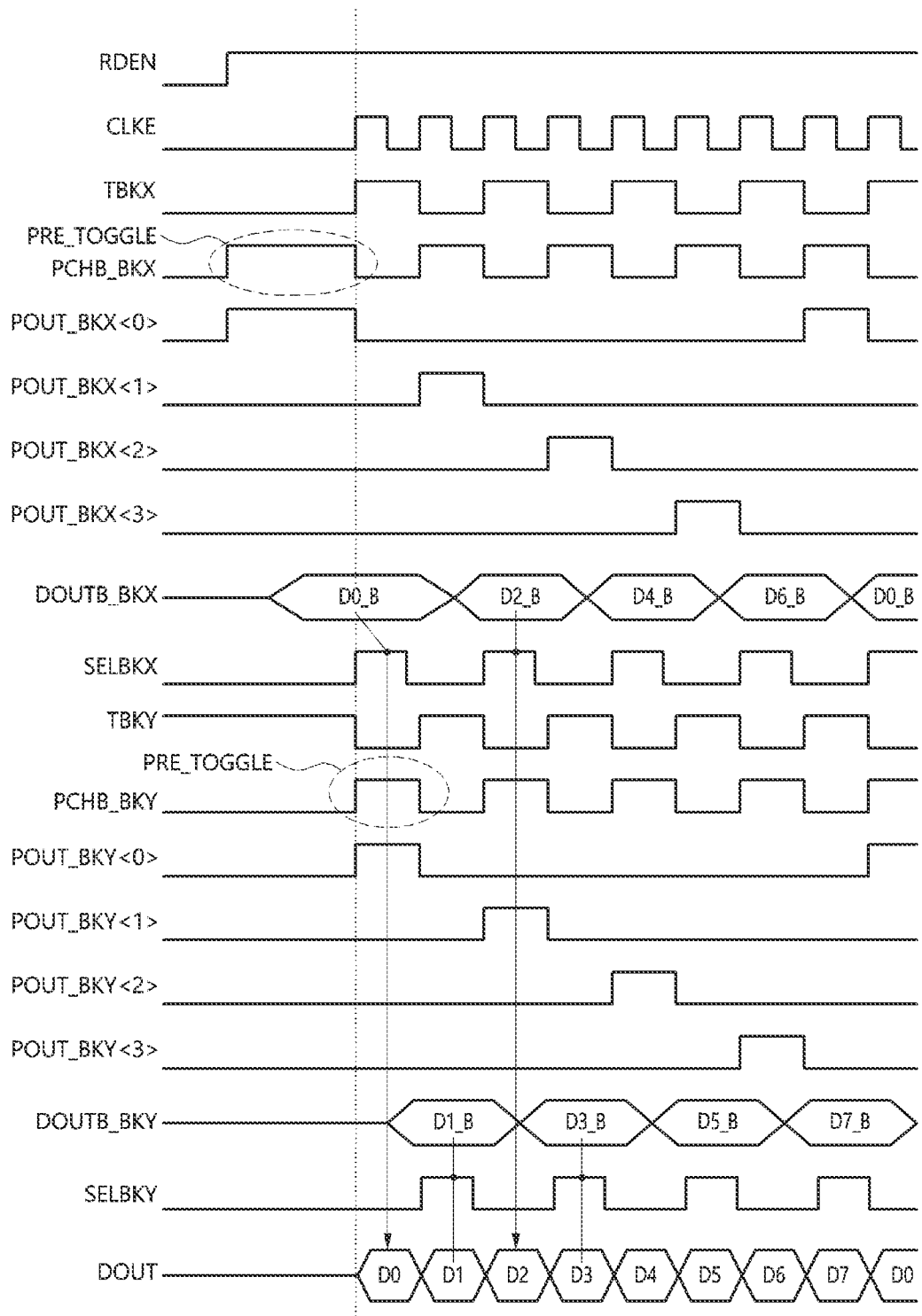
FIG. 9 is a timing diagram illustrating an operation of the pipe register in accordance with an embodiment.

FIG. 9 is a timing diagram illustrating an operation of the pipe register 201 in accordance with an embodiment. Referring to FIGS. 1 to 9, operations of the pipe register 201 will be described.

When a read command is input to the semiconductor apparatus 100 from the external, the read enable signal RDEN may be generated and the clock signal CLKE may be input to the semiconductor apparatus 100 from the external at a time interval which is predetermined by operation specification of the semiconductor apparatus. The read enable signal RDEN may be generated in the semiconductor apparatus 100 and the clock signal CLKE may be input to the semiconductor apparatus 100 in the first time after the read enable signal RDEN is activated. The clock signal, in an embodiment, toggling high and low during an activation time of the read enable signal as shown, for example, in FIG. 9.

The register units 202-0 to 202-n of the first register group 202 may perform precharge operation in response to the first latch control signal PCHB_BKX. The first latch control signal PCHB_BKX may have a pre-toggle section before a corresponding pulse thereto among pulses of the clock signal CLKE is activated. In such a case, the first latch control signal PCHB_BKX may have a pre-toggle section before the first pulse of the clock signal CLKE. Therefore, the first register group 202 may be ready to output data before the corresponding pulse of the clock signal CLKE is activated.

The register units 203-0 to 203-n of the second register group 203 may perform precharge operation in response to the second latch control signal PCHB_BKY. The second latch control signal PCHB_BKY may have a pre-toggle section before a corresponding pulse thereto among pulses of the clock signal CLKE is activated. in such a case, the second latch control signal PCHB_BKY may have a pre-toggle section before the second pulse of the clock signal CLKE. Therefore, the second register group 203 may be ready to output data before the corresponding pulse of the clock signal CLKE is activated.

The first register group 202 and the second register group 203 may sequentially output the first preliminary data DOUTB_BKX and the second preliminary data DOUTB_BKY based on the first latch control signals POUT_BKX<0:3> and the second latch control signals POUT_BKY<0:3>. That is, the first register group 202 may output the first preliminary data DOUTB_BKX, e.g., D0_B, D2_B, D4_B, and D6_B, in response to the first latch control signals POUT_BKX<0:3>. The second register group 203 may output the second preliminary data DOUTB_BKY, e.g., D1_B, D3_B, D5_B, and D7_B, in response to the second latch control signals POUT_BKY<0:3>.

The first preliminary data DOUTB_BKX, e.g., D0_B, D2_B, D4_B, and D6_B, and the second preliminary data DOUTB_BKY, e.g., D1_B, D3_B, D5_B, and D7_B are alternatively selected in accordance with the first selection signal SELBKX and the second selection signal SELBKY, and output data DOUT, e.g., D0, D1, D2, D3, D4, D5, D6, and D7, may be generated in synchronization with the clock signal CLKE.

As described above, in various embodiments, based on the first latch control signal PCHB_BKX and the second latch control signal PCHB_BKY each of which has the pre-toggle section, the semiconductor apparatus may be ready to output data at a point of time earlier than the corresponding pulse thereto among the pulses of the clock signal CLKE and thus output the data to the external of the semiconductor apparatus in synchronization with the clock signal without data processing delay or minimizing data processing delay of the pipe register 201. Accordingly, in an embodiment, the semiconductor apparatus 100 may reduce the timing margin between a control signal employed for controlling the operation of the pipe register 201 and the data output from the pipe register 201 and improve the operation speed thereof.

While various embodiments have been described above, it will be understood to those skilled in the art that various changes and modifications may be made therein without departing from the spirit and scope of the present disclosure. It should be understood that the embodiments described above are examples only and the present disclosure is not limited to the embodiments. The scope of the present disclosure may be defined in the following claims rather than the described embodiments, and the present disclosure encompasses all such changes and modifications that fall within the scope of the claims and the equivalents thereof.

What is claimed is:
1. A pipe register comprising:
   a plurality of register units configured to output data in response to control signals; and
   a pipe control circuit configured to generate a reference timing signal by dividing a clock signal and generate the control signals based on a read enable signal and the reference timing signal,
   wherein the clock signal is activated in a first time after an activation time of the read enable signal, and at least one of the control signals has a pre-toggle section before a first pulse of the clock signal.
2. The pipe register according to claim 1, wherein the read enable signal is generated by a device, which includes the pipe register, when a read command is input to the device, and the clock signal is input from another device external to the device.
3. The pipe register according to claim 1, wherein the pipe control circuit includes:
   a reference timing signal generating circuit configured to generate the reference timing signal by dividing the clock signal; and
   a latch control signal generating circuit configured to generate at least one of the control signals based on the read enable signal and the reference timing signal.
4. A pipe register comprising:
   a first register group configured to output a first preliminary data in response to a first latch control signal;
   a second register group configured to output a second preliminary data in response to a second latch control signal; and
   a pipe control circuit configured to generate a first reference timing signal and a second reference timing signal by dividing a clock signal and generate the first latch control signal and the second latch control signal based on a read enable signal, the first reference timing signal, and the second reference timing signal,
   wherein the clock signal is activated in a first time after an activation time of the read enable signal, and at least one of the first latch control signal and the second latch control signal has a pre-toggle section before a first pulse of the clock signal.
5. The pipe register according to claim 4, wherein the read enable signal is generated by a device which includes the pipe register when a read command is input to the device, and the clock signal is input from another device external to the device.
6. The pipe register according to claim 4, wherein the pipe control circuit is configured to activate the first latch control signal before the first pulse among pulses of the clock signal is activated, the first pulse corresponding to the first register group, and configured to activate the second latch control signal before a second pulse among pulses of the clock signal is activated, the second pulse corresponding to the second register group.

7. The pipe register according to claim 4, wherein the pipe control circuit includes:
   a reference timing signal generating circuit configured to generate the first reference timing signal and the second reference timing signal by dividing the clock signal; and
   a latch control signal generating circuit configured to generate the first latch control signal and the second latch control signal based on the read enable signal, the first reference timing signal, and the second reference timing signal.

8. The pipe register according to claim 7, wherein the pipe control circuit further includes:
   a selection signal generating circuit configured to generate a first selection signal and a second selection signal based on the first reference timing signal and the second reference timing signal.

9. The pipe register according to claim 8, further comprising:
   a first switch configured to block the output of the first register group in response to the first selection signal; and
   a second switch configured to block the output of the second register group in response to the second selection signal.

10. A semiconductor apparatus comprising:
    a memory region;
    an input and output (input/output) pad unit; and
    a data input/output circuit configured to input/output data between the memory region and the input/output pad unit,
    wherein the data input/output circuit is configured to latch data output from the memory region based on a read enable signal and output the latched data to an external of the semiconductor apparatus according to control signals,
    wherein the control signals are generated according to a clock signal, and
    wherein the clock signal is activated in a first time after an activation time of the read enable signal, and at least one of the control signals has a pre-toggle section before a first pulse of the clock signal.

11. The semiconductor apparatus according to claim 10, wherein the read enable signal is generated by the semiconductor apparatus when a read command is input to the semiconductor apparatus, and the clock signal is input from a device external to the semiconductor apparatus.

12. The semiconductor apparatus according to claim 10, wherein the data input/output circuit includes a pipe register, wherein the pipe register includes:
    a first register group configured to output a first preliminary data output from a first unit memory region of the memory region in response to a first latch control signal;
    a second register group configured to output a second preliminary data output from a second unit memory region of the memory region in response to a second latch control signal; and
    a pipe control circuit configured to generate a first reference timing signal and a second reference timing signal by dividing the clock signal, and generate the first latch control signal and the second latch control signal based on the read enable signal, the first reference timing signal, and the second reference timing signal.

13. The semiconductor apparatus according to claim 12, wherein the pipe control circuit is configured to activate the first latch control signal before a first pulse among pulses of the clock signal is activated, the first pulse corresponding to the first register group.

14. The semiconductor apparatus according to claim 13, wherein the pipe control circuit is configured to activate the second latch control signal before a second pulse among pulses of the clock signal is activated, the second pulse being corresponding to the second register group.

15. The semiconductor apparatus according to claim 12, wherein the pipe control circuit includes:
    a reference timing signal generating circuit configured to generate the first reference timing signal and the second reference timing signal by dividing the clock signal; and
    a latch control signal generating circuit configured to generate the first latch control signal and the second latch control signal based on the read enable signal, the first reference timing signal, and the second reference timing signal.

16. The semiconductor apparatus according to claim 15, wherein the pipe control circuit further includes:
    a selection signal generating circuit configured to generate a first selection signal and a second selection signal based on the first reference timing signal and the second reference timing signal.

17. The semiconductor apparatus according to claim 16, further comprising:
    a first switch configured to block the output of the first register group in response to the first selection signal; and
    a second switch configured to block the output of the second register group in response to the second selection signal.

* * * * *